(12) United States Patent
Wenham et al.

(10) Patent No.: US 8,153,890 B2
(45) Date of Patent: Apr. 10, 2012

(54) LOW AREA SCREEN PRINTED METAL CONTACT STRUCTURE AND METHOD

(75) Inventors: Stuart Ross Wenham, New South Wales (AU); Ly Mai, New South Wales (AU); Zhengrong Shi, Wuxi (CN); JingJia Ji, Shanghai (CN)

(73) Assignees: NewSouth Innovations Pty Ltd., New South Wales (AU); Suntech Power Co. Ltd., Wuxi (CN)

( * ) Notice: Subject to any disclaimer, the term of this patent is extended or adjusted under 35 U.S.C. 154(b) by 688 days.

(21) Appl. No.: 12/125,817

(22) Filed: May 22, 2008

(65) Prior Publication Data

US 2009/0007962 A1 Jan. 8, 2009

Related U.S. Application Data

(63) Continuation-in-part of application No. PCT/AU2006/001603, filed on Oct. 26, 2006.

(30) Foreign Application Priority Data

Nov. 24, 2005 (AU) ................................ 2005906552
Nov. 29, 2005 (AU) ................................ 2005906662

(51) Int. Cl.
*H01L 31/00* (2006.01)
*H01L 21/00* (2006.01)
(52) U.S. Cl. .......................................... 136/256; 438/98
(58) Field of Classification Search .................. 136/256; 438/98, 542; 257/E21.538
See application file for complete search history.

(56) References Cited

U.S. PATENT DOCUMENTS

| 4,726,850 A * | 2/1988 | Wenham et al. ............... 136/256 |
| 6,162,658 A | 12/2000 | Green |
| 6,429,037 B1 * | 8/2002 | Wenham et al. ................ 438/57 |
| 2005/0126627 A1 | 6/2005 | Hayashida |
| 2005/0172998 A1 | 8/2005 | Gee |

FOREIGN PATENT DOCUMENTS

| WO | WO0215282 A1 | 2/2002 |
| WO | WO2006005116 A1 | 1/2006 |

* cited by examiner

*Primary Examiner* — Basia Ridley
*Assistant Examiner* — Tamir Ayad
(74) *Attorney, Agent, or Firm* — Vedder Price P.C.; Thomas J. Kowalski; Deborah L. Lu

(57) ABSTRACT

A solar cell comprises adjacent regions of oppositely doped semiconductor material forming a pn junction substantially parallel to front and rear surfaces of the solar cell. A surface of the semiconductor material has a plurality of depressions, with semiconductor material regions forming internal wall surface regions of the depressions being doped to the polarity of one of the semiconductor regions, with which they are in electrical communication. The wall surface regions of the depressions are isolated from the other oppositely doped semiconductor region and form contact points for a contact structure contacting the surface in which the depressions are formed. A dielectric layer is formed over the surface, the dielectric layer being thinner or non-existent in at least a portion of each depression, such that a screen printed metal contact structure formed over the dielectric layer and extending into the depressions makes contact with the semiconductor material in the depressions after sintering.

21 Claims, 10 Drawing Sheets

LOW AREA SCREEN PRINTED METAL CONTACT STRUCTURE AND METHOD

This application is a continuation-in-part application of international patent application Serial No. PCT/AU2006/001603 filed 26 Oct. 2006, which published as PCT Publication No. WO 2007/059551 on 31 May 2007, which claims benefit of Australian patent application Serial Nos. 2005906552 filed 24 Nov. 2005 and 2005906662 filed 29 Nov. 2005.

The present invention relates to the field of photovoltaics and in particular provides a new contact structure for commercially produced solar cells.

BACKGROUND TO THE INVENTION

High performance solar cells in general require low area contacts to minimise the contribution of the high recombination velocity metal/silicon interface to the device dark saturation current. Most laboratory solar cells use photolithographic techniques or laser scribing to facilitate the formation of low area metal contacts to the silicon that typically cover less than 1% of the solar cell surface. This minimises the device dark saturation current which in turn maximises the cell open circuit voltage (Voc). The highest Voc values ever achieved for silicon solar cells is in the vicinity of 720 mV, through careful attention to minimising the recombination taking place at the front and rear surfaces and particularly at the metal/silicon interfaces.

In comparison, the dominant commercial solar cell, namely the screen-printed solar cell shown schematically in FIG. 1, has a relatively large metal/silicon interface area in the vicinity of 10% for the front surface and often approaching 100% for the rear metal contact. Such a cell is shown schematically in FIG. 1 and comprises a silicon substrate 11, the bulk of which is lightly doped p-type, a thin top layer 12 lightly doped n-type to form a junction with the p-type region 11, front contact fingers 14 under which there is generally a heavily doped n-type region 13 and on the rear surface a continuous rear contact 15 makes connection with the p-type region 11. Such cells achieve relatively low efficiencies and voltages compared to high efficiency laboratory cells. To improve the performance of such cells, attention needs to be paid to improving the front and rear surface passivation and in particular, developing approaches for reducing the metal/silicon interface area for both metal contacts to much lower values.

Any discussion of documents, acts, materials, devices, articles or the like which has been included in the present specification is solely for the purpose of providing a context for the present invention. It is not to be taken as an admission that any or all of these matters form part of the prior art base or were common general knowledge in the field relevant to the present invention as it existed before the priority date of each claim of this application.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

SUMMARY OF THE INVENTION

According to one aspect, a solar cell is provided comprising:

i) adjacent regions of oppositely doped semiconductor material forming a pn junction substantially parallel to front and rear surfaces of the solar cell:

ii) a surface of the semiconductor material having a plurality of depressions, with semiconductor material forming internal wall surface regions of the depressions being doped to the polarity of one of the semiconductor regions of the junction, with which it is in electrical communication, and said wall surface regions being isolated from the other oppositely doped region of the junction;

iii) a dielectric layer formed over the surface of the semiconductor material of the cell, the dielectric layer being thinner or non-existent in at least a portion of each depression; and iv) a screen printed metal contact structure formed over the dielectric layer and extending into the depressions whereby the metal structure makes contact with the semiconductor material in the depressions.

According to another aspect, a method is provided for fabricating a contact structure on a solar cell comprising adjacent regions of oppositely doped semiconductor material forming a pn junction substantially parallel to front and rear surfaces of the solar cell, the method including:

i) forming a series of depressions in a surface of the semiconductor material with semiconductor material forming internal wall surface regions of the depressions being doped to the polarity of one of the semiconductor regions of the junction, with which it is in electrical communication, and said wall surface regions being isolated from the other oppositely doped region of the junction;

ii) forming a dielectric layer over the surface of the semiconductor material of the cell whereby the dielectric layer in the depressions is thinner than the layer on the surface, or non-existent;

iii) forming a screen printed contact structure which extends into the depressions; and iv) firing the structure to sinter the screen printed contact structure whereby the contact structure contacts the solar cell surface in the depressions.

Depending upon the method of forming the dielectric layer it may either not extend into the depressions (for example if the depressions are formed through a pre-existing dielectric layer or if the dielectric is otherwise aligned during its formation) or it may partially extend into the depressions or may extend into the depressions as a thinner layer than that on the surface outside of the depressions.

When the dielectric layer extends into the depressions as a thinner layer than on the surface outside of the depressions the firing step will drive the metal of the contact structure through the thinner dielectric in the depressions to contact the underlying semiconductor material while being prevented from contacting the semiconductor material by the thicker dielectric layer outside of the depressions.

Preferably, the surface regions of the depressions are doped more heavily than the semiconductor material of the surrounding surfaces. In the case of a top, or light receiving surface, the depressions are preferably a series of parallel elongate grooves. Additional wells may also be provided between the grooves areas in regions to be covered by the metal contact structure.

On the light receiving surface, the metal contact structure is preferably a set of fingers running perpendicularly to the grooves, with interconnecting fingers running parallel to the grooves at intervals to form a grid. In the event that grooves are not employed (i.e., only wells) a tighter grid structure will be employed.

On a rear (non light receiving) surface, the depressions are preferably a series of wells, though grooves or other shapes can also be employed. The metal contact structure for simplicity is preferably an uninterrupted layer of screen printed metal, but may also be a grid or finger structure if desired.

The surface regions of the depressions are preferably doped to a higher doping level than the remainder of the surrounding surface.

In a preferred method the surface depressions are formed by forming a surface oxide layer and laser scribing through oxide layer to simultaneously form a doping mask. Subsequently, to the doping of the surface regions in the depression, the oxide is preferably removed and replaced with the final dielectric layer, which is applied by a method which preferentially forms the dielectric material on the surface between the depressions with the dielectric layer on the surface in the depressions being non existent or at least significantly thinner that that on the surface between the depressions. However it would also be possible to use the oxide layer (or any similar layer used as the masking layer) as the final dielectric layer.

Preferably, the depressions have widths in the range of 15-50 µm. The depth is not critical and might be for example in the range of 10-100 µm, however any depth (greater than the above range) should work provided that, if the depressions are very deep the metal paste used to screen print the contacts is sufficiently viscous that it does not slump to the bottom of the depression causing a discontinuity at the top of the depression. Of course, viscosity is not an issue if the depressions are relatively shallow (say with a width to depth ratio of in the range of 1:1 to 1:2, or even lower, for example). In one embodiment the depressions comprise grooves and wells which are 25-35 µm (preferably 30 µm) wide and 40-50 µm (preferably 45 µm) deep.

Typically when grooves are used as the depressions, the grooves are located on a pitch of in the range of 0.2 to 3.0 mm with the optional wells are separated on a pitch of in the range of 50-1500 µm in the direction of the contact fingers under which they are located. Contact fingers are typically separated on a pitch of in the range of 1 to 10 mm and while the fingers may in some embodiments be preferred to be on a pitch of in the range of 1 to 3 mm, they are more generally preferred to be on a pitch in the range of 3-4 mm.

In the case of a cell with an n-type light receiving surface region and a p-type back surface region, the light receiving surface region will typically be doped to provide a conductivity in the range of 50-1000 ohms per square while the surface regions in the depressions will typically be doped to provide a conductivity in the range of 1-50 ohms per square with the depression surface region doping concentration being above $10^{17}$ atoms/cm$^3$ and preferably above $10^{19}$ atoms/cm$^3$, however the surface regions in the depressions may also be doped at a similar level to the remainder of the surface region of the cell material. The surface region on the light receiving surface will typically be in the range of 0.01 to 0.4 µm deep whereas the doped surface region in the depressions will typically have a depth in the range of 0.4 to 1.0 µm at its deepest point. In the simplest case the rear surface region doping will effectively be the same as the bulk of the cell which will typically be doped in the order of $10^{15}$ to $10^{17}$ atoms/cm$^3$ while the surface regions in the respective depressions will be either left the same as the bulk if sufficiently high or else separately doped to provide a surface layer region, in the depression, with a conductivity in the range of 1 to 50 ohms per square, with a surface region dopant concentration above $10^{17}$ atoms/cm$^3$ and preferably above $10^{19}$ atoms/cm$^3$. In the case where the surface regions in the respective rear surface depressions are separately doped, the doped surface region in the depressions will typically have a depth in the range of 0.4 to 1.0 µm at its deepest point. The rear surface may also have an n+ region between the contacts in which case this surface region will typically be doped to provide a conductivity in the range of 50 to 1000 ohms per square. Alternatively a p-type region may extend over the entire rear surface between the contacts in which case this surface region will also typically be doped to provide a conductivity in the range of 50 to 1000 ohms per square.

To simplify the doping of the walls of the depressions (wells or grooves) in commercial processes, by reducing the number of processing steps, and thereby reducing the cost, it is possible to deliberately add dopants into the surface dielectric layer such that when the laser is used to drill surface depressions for the contacts some of the dopants from the dielectric layer are automatically incorporated into the surface regions of the depressions, therefore avoiding the necessity for a separate diffusion step. However, in the highest performance devices the surface regions of the depressions are not doped in this way as the electrical performance of the cells is not quite as good.

According to yet another aspect, a method is provided for applying a reagent to a surface of a structure during the formation of a solar cell comprising adjacent regions of semiconductor material forming a pn junction substantially parallel to front and rear surfaces of the solar cell, the method including:
  i) placing the structure on a carrier of an inkjet print mechanism where a source of the reagent is connected to a print head of the print mechanism; and
  ii) scanning the print head relative to the structure such that the print head passes over the areas where the reagent is to be applied and operating the print head to apply the reagent when an area to which the reagent is to be applied is located under the print head.

Preferably the print mechanism is an X-Y table that moves the structure being processed in two dimensions under a fixed print head. Preferably also the print structure also includes a laser which can be used to perform heating or scribing steps while the structure is being printed with reagent.

BRIEF DESCRIPTION OF THE DRAWINGS

Embodiments of the contact scheme will now be described, by way of example with reference to the accompanying drawings in which.

DETAILED DESCRIPTION OF SOLAR CELL CONTACT STRUCTURES

Figure 1:
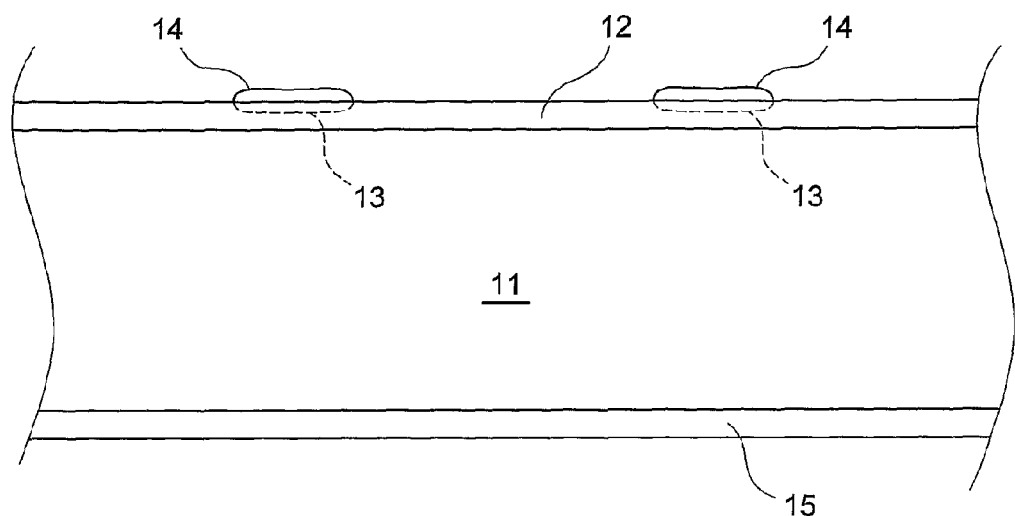
FIG. 1 schematically illustrates a prior art cell structure formed with screen printed contacts.
Figure 2:
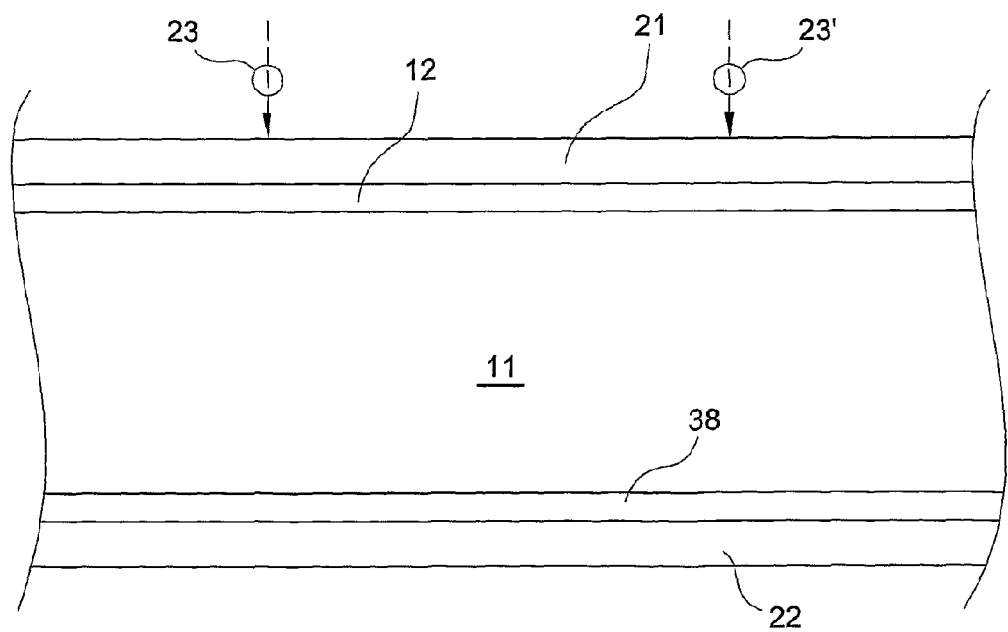
FIG. 2 illustrates a substrate with surface regions doped and oxide layers formed on the surface in preparation for formation of contacts according to the present design.

Referring to the drawings, in embodiments of the present contact structure, a dielectric layer is used across the top surface of a solar cell for four (4) purposes. Firstly, it is used to isolate the subsequently printed screen printed metal from the top surface of the wafer. Secondly, it is used to passivate the top surface of the silicon wafer. Thirdly, it is used as an antireflection coating for the silicon wafer (although this aspect is less important if this metal contacting scheme is being used on the rear surface of a solar cell). Fourthly it is used to provide a reduced thickness (even zero thickness in some cases) layer in regions below the top surface, such as where wells or grooves have been made in the silicon surface prior to depositing the dielectric layer. The purpose of these reduced thickness regions is so that the screen-printed metal is able to be driven through the thinner dielectric layer in these regions so as to contact the underlying silicon, while remaining isolated from the top surface silicon where the dielectric layer is thicker. This provides a mechanism for achieving low area contacts (i.e. small metal/silicon interface area) for screen printed metal where the contact area can be chosen independently from the area covered by the screen-printed paste. For example, for the rear surface of a screen-printed solar cell where the metal covering is normally approaching 100%, 20 micron diameter wells can be drilled in the silicon surface every 1 mm to facilitate an effective metal/silicon interface area after firing the screen printed metal of well under 1% of the rear surface area by using the thicker rear surface regions of the dielectric to isolate more than 99% of the screen-printed metal from the silicon.

A range of different deposition approaches can be used to achieve the required thickness differential for the dielectric layer in the wells or grooves relative to the front or rear surface regions. Evaporation techniques for the dielectric layer naturally provide little material thickness on steeply sloping regions such as the walls of wells or grooves. Deposition by plasma enhanced chemical vapour deposition (PECVD) also provides thinner deposited layers within grooves and wells due to the restricted access into such regions for the ionic species generated in the plasma and the relatively large surface areas to be coated in such regions. The dielectric material can also be formed before the wells and/or grooves are etched in which case there will be no dielectric left in the wells and/or grooves after they are formed. Alternatively a deposition technique might be used which places the dielectric only where it is required such as by using an inkjet printing technique to place a dielectric forming reagent only in those places where a thick dielectric layer is required. This later technique might also be accompanied by localised heating such as by a laser to speed the reaction of the reagent.

An important issue when establishing metal contacts to semiconductor material, such as in a solar cell, is the contact resistance between the metal and semiconductor. This resistance is often roughly inversely proportional to the contact area, such that more careful attention needs to be paid to such contact resistance in low area contacts. It is often beneficial to heavily dope the groove or well walls with n or p-type dopants prior to depositing the dielectric layer, so as to provide better ohmic contact in these regions. In addition, to further control the contact resistance, the number and density of such wells and grooves located underneath the screen-printed metal can be specifically controlled so as to achieve whatever required contact resistance for the metal/silicon interface. Heavy doping in surface regions of such wells and grooves will often require masking of the front and/or rear surfaces of the wafer so as to avoid the detrimental effects on cell performance that result from having large volumes of heavily doped silicon, particularly on the light receiving surface for the solar cell. In some implementations of the present contact scheme, two or more dielectric layers may even be beneficially used. For example, a silicon dioxide layer may be grown onto the front surface of the wafer following a light phosphorus diffusion of the top surface. The desired wells and/or grooves can then be formed through this oxide layer, such as through the use of a laser, with the subsequent heavy diffusion being confined to these regions through the use of the surface silicon dioxide layer acting as a mask to protect it from further diffusion of dopants. Provided this silicon dioxide (or other dielectric layer) that has been acting as a mask is not damaged and is therefore able to still isolate the screen-printed metal from the lightly diffused surface regions, no additional dielectric layer deposition may be necessary. However, if the remaining masking layer is not suitable either as an AR coating or to isolate the screen-printed metal from the lightly diffused surface region of the cell, or to passivated the silicon surface, then the masking layer can be removed and another dielectric layer (such as silicon nitride by evaporation, PECVD or sputtering) can then be deposited as described above to facilitate contact being made in the well or groove regions. Alternatively, in some cases it may be considered beneficial to retain multiple dielectric layers whereby the first provides good surface passivation of the silicon and the second acts firstly as an AR coating, secondly it provides the thickness differential between the well/groove surface regions and the top surface region to facilitate localised contacting between the metal and silicon, and thirdly it provides the isolation between the screen-printed metal and the lightly diffused cell surface region.

Figure 3:
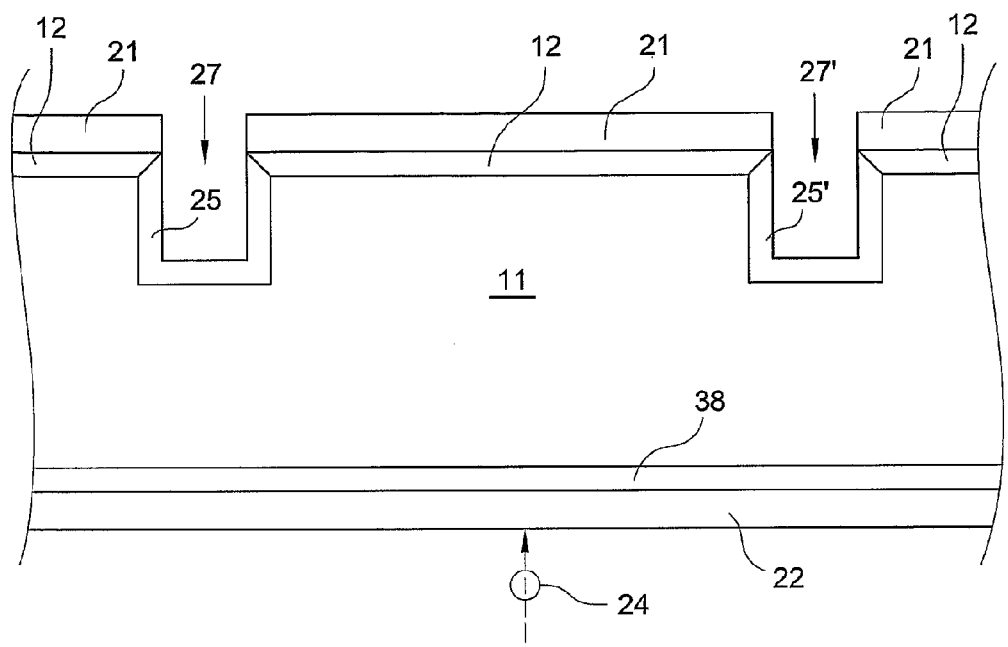
FIG. 3 illustrates the substrate of FIG. 2 after front surface grooves have been formed and the surface regions of the groove heavily doped.
Figure 4:
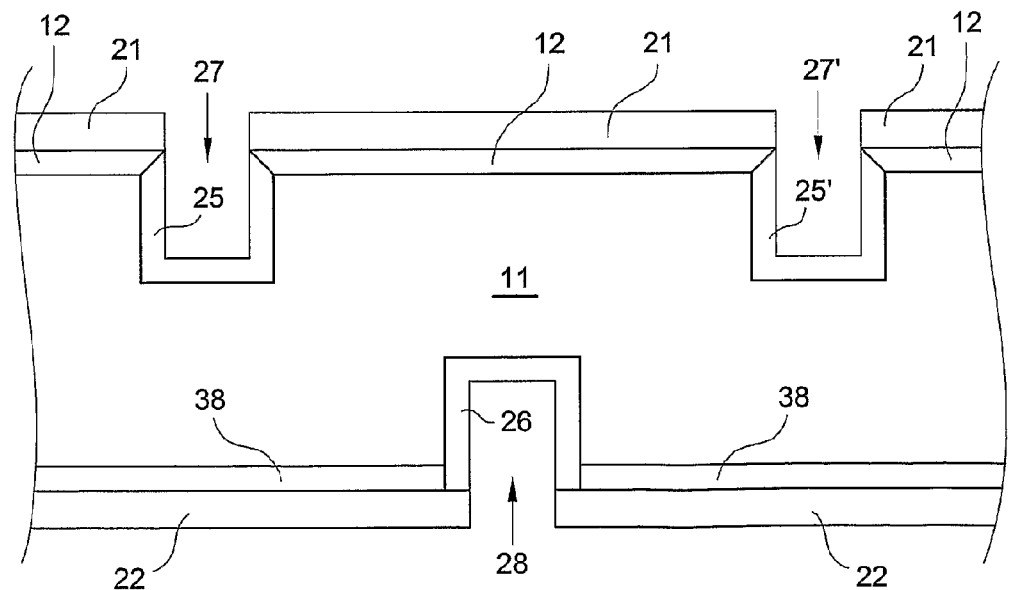
FIG. 4 illustrates the substrate of FIG. 3 after rear surface grooves have been formed and the surface regions of the groove heavily doped.
Figure 5:
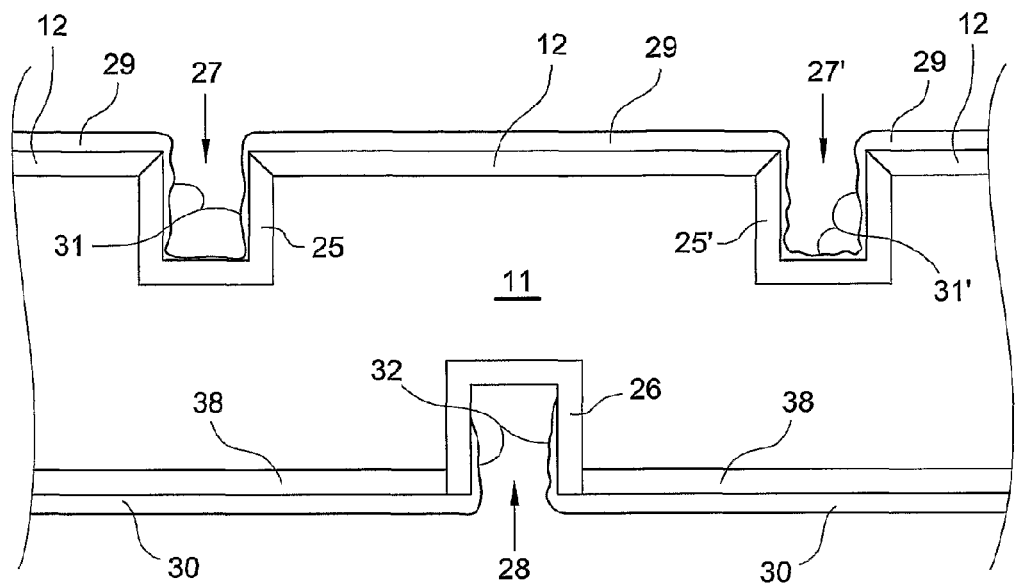
FIG. 5 illustrates the substrate of FIG. 4 with the surface oxides removed and a nitride layer applied to each surface.
Figure 6:
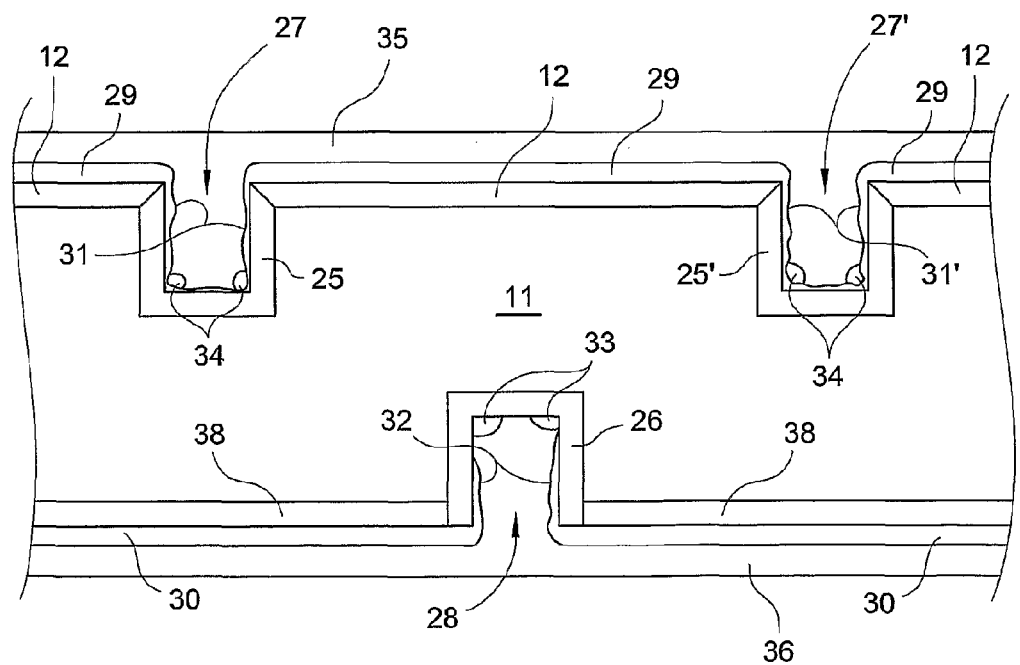
FIG. 6 illustrates the substrate of FIG. 5 after front and rear metal has been applied.
Figure 7:
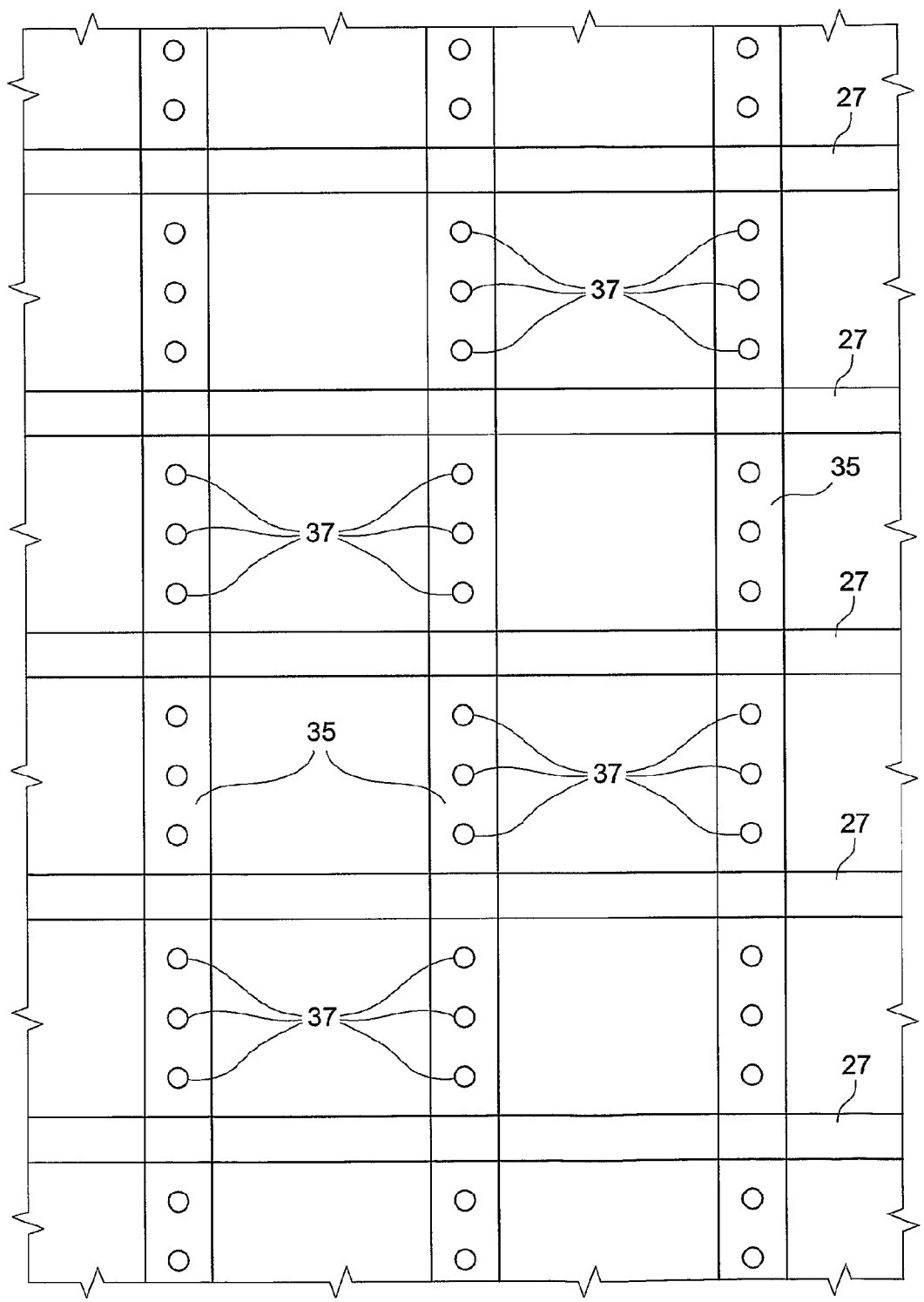
FIG. 7 illustrates a top view of the substrate of FIG. 6 showing the relative positions of grooves, wells and metal fingers.

This contact scheme can be used particularly effectively in conjunction with the concept of semiconductor fingers which is described by Wenham, Mai and Ho, "High Efficiency Solar Cells", Conference Record, 8th Chinese Photovoltaic Conference, Shenzen, November 2004. In this example of the contact scheme heavily doped grooves (and/or wells) 27, 28 are formed in the solar cell surface (front or rear), as shown schematically in FIG. 3 with typical dimensions and sheet resistivity values as described below. In embodiments of this contact scheme, the dielectric layer 29, 30 (such as silicon nitride) is then deposited, forming a reduced thickness layer 31, 32 within the wells and/or grooves relative to the surface between the wells and/or grooves as shown in FIG. 5. The screen printed metal lines 35 are then deposited perpendicularly to the semiconductor fingers (doped grooves) 27 on the top surface as shown in FIG. 6 and FIG. 7 (illustrating the front surface), remaining isolated from the lightly diffused top surface region by the dielectric layer 29, while being able to make contact to the grooved regions 27 where the dielectric layer 31 is of reduced thickness. To aid contact formation, at the time of forming the grooves, additional wells 37 (ref FIG. 7) or grooves can be simultaneously formed in the path where the metal fingers 35 are to be deposited, thereby increasing the metal/silicon interface area to a more desirable value. The inclusion of the latter however will necessitate subsequent alignment between the location of the wells 37 and the proposed location of the screen-printed metal fingers. The desired doping concentration and dose for the surface regions of the walls of the wells 37 or grooves 27 is such as to produce a sheet resistivity in the range 1-50 ohms per square however the surface regions in the depressions (ie wells or grooves) may also be doped at a similar level to the remainder of the surface region of the cell, provided the semiconductor regions forming the walls of the wells 37 or grooves 27 are deep enough. In comparison, the sheet resistivity for the wafer surface region adjacent to the wells or grooves is preferably in the range of 50-1,000 ohms per square although this contact scheme can also work well where no diffusion of the wafer surface takes place. The surface region on the light receiving surface will typically be in the range of 0.01 to 0.4 µm deep whereas the doped surface regions in the depressions will typically have a depth in the range of 0.4 to 1.0 µm at its deepest point.

Another example of the implementation of this contact scheme is for the formation of a rear metal contact 36 for a solar cell, where shading is unimportant. In this case it is feasible to cover the entire rear surface of the solar cell with screen printed metal 36 (see FIG. 6), but restrict the metal/silicon interface area to places where wells and or grooves 28 are deliberately located on this surface. In the simplest case the rear surface region is an extension of the bulk of the cell and doping will effectively be the same as the bulk of the cell which will typically be doped in the order of $10^{15}$ to $10^{17}$ atoms/cm$^3$ while the surface regions in the respective depressions will be either left the same as the bulk if sufficiently high or else separately doped to provide surface regions with a conductivity in the range of 1 to 50 ohms per square, with a surface region concentration above $10^{17}$ atoms/cm$^3$ and preferably above $10^{19}$ atoms/cm$^3$. In the case where the surface regions in the respective rear surface depressions are separately doped, the doped surface regions in the depressions will typically have a depth in the range of 0.4 to 1.0 µm at its deepest point. Again, a dielectric layer 30 is deposited after the wells/grooves have been formed and/or diffused, with contact only subsequently being made in the reduced thickness regions within the wells or grooves 28. If alignment is not considered an issue, reduced metal consumption can be achieved by forming the screen-printed contact as a grid like structure on the front surface, with the wells/grooves restricted in location to where the metal will be deposited. Alternatively, alignment issues can be avoided if wells/grooves are roughly uniformly spaced, but located over the entire surface, such that the location of the metal grid is no longer critical. This will however increase the dark saturation current for the device due to the increased volume of heavily doped silicon.

Figure 8:
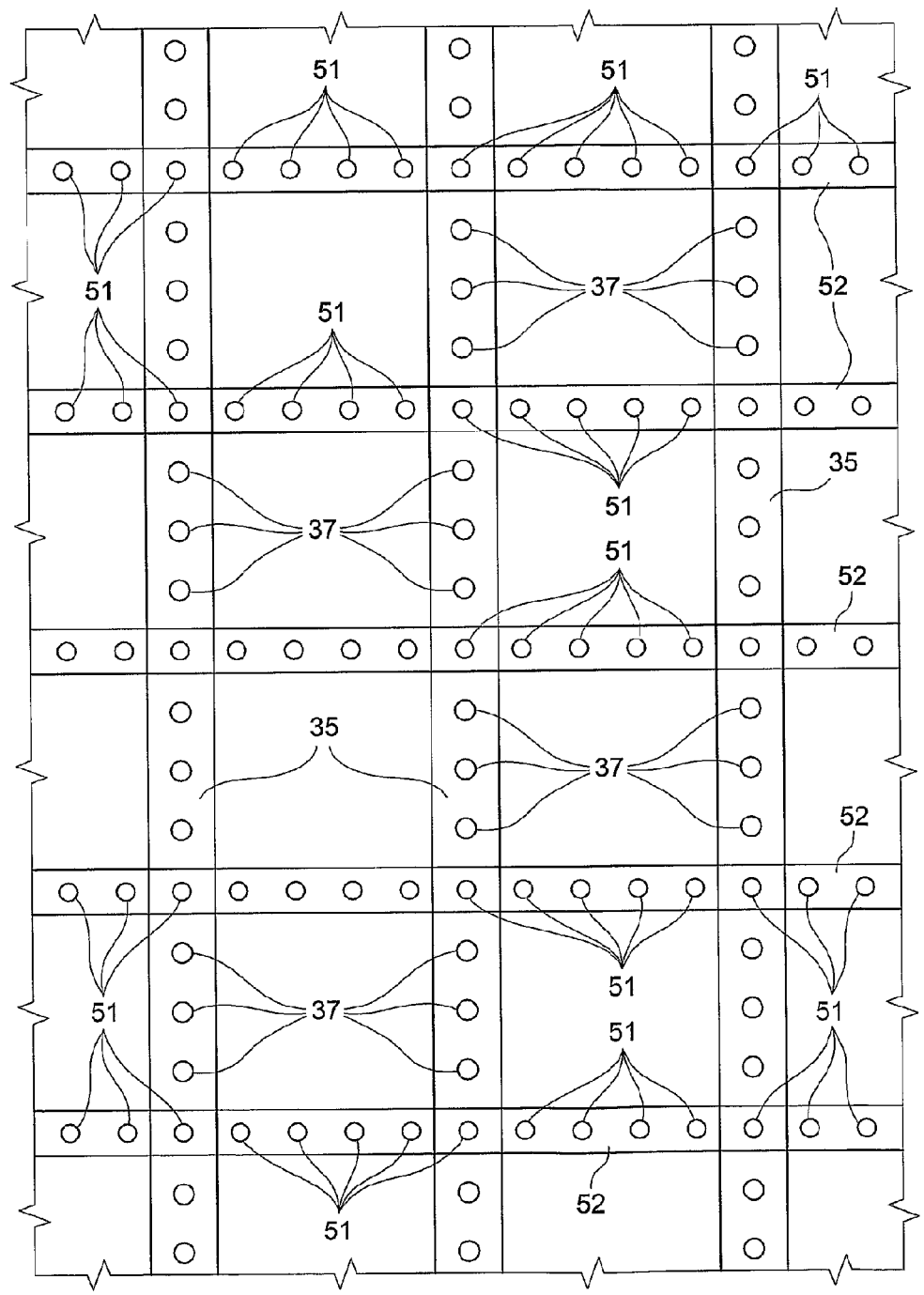
FIG. 8 illustrates a top view similar to that of FIG. 7 where doped grooves have been replaced by doped wells.

Referring to FIG. 8 a top view of an alternative embodiment is shown in which doped wells 51 replace the doped grooves 27 and wells 51 are connected by contact fingers 52. The perpendicular fingers 35 are also provided as in the arrangement of FIG. 7, to interconnect the fingers 52, and wells 37 may also be provided to further enhance the connection to the underlying semiconductor region. The arrangement of FIG. 8 can be used on front surfaces or by replacing the wells 51 with wells 28 of FIG. 6 a similar structure can be used on rear surfaces. In the case of rear surfaces the contact grid formed by the fingers 35 and 52 may be replaced by an uninterrupted metal layer as described above.

A challenge though with using wells or grooves fully covered by the screen-printed metal is that air is trapped in the well or groove. This can cause a problem with subsequent heating or placement of the cell in a vacuum where large forces can be exerted by the trapped air on the metallization. The potential problems caused by this can be minimized by either keeping the wells very shallow so minimal air is trapped, or else using elongated wells or groves so that the screen-printed metal only covers part of the well or grove region so as to allow air to escape during subsequent processes.

An alternative approach to achieving the dielectric thickness variation needed to give the selective contact through the reduced thickness regions is to use an alternative dielectric layer deposition approach that can produce different thicknesses of dielectric in different regions, independently of the geometry of the surface being coated and contacted. An example of such an approach is to use a dielectric that can be applied as a liquid so that it can be ink jet printed onto the regions where contact between the metal and the solar cell surface is to be avoided. Following the deposition of such a dielectric material by ink jet printing, some heating of the material will normally be required so as to give the dielectric layer its desired properties. Examples of dielectric layers that can be applied in this way include silicon dioxide, titanium dioxide, various polymers, etc, or even multiple layers of different dielectrics can be used. If screen-printed metal contacts are being used, the thickness of such ink jet printed material needs to be sufficiently thick so that at the completion of all the heat treatments, the overlying metal has not penetrated through to the solar cell's surface. This is particularly important if the polarity of the doped silicon in such regions is opposite to that in the areas where the dielectric is of reduced or no thickness which is where the metal is to intentionally contact the silicon. An example of the latter would be for a positive rear metal contact where the rear surface region of the silicon is lightly diffused with n-type dopants such as phosphorus. In this case, everywhere that contact between the n-type silicon and the metal is to be avoided, a dielectric layer such as liquid spin-on silicon dioxide is ink jet printed so as to protect the n-type silicon (it should be noted that the equivalent structure can be produced by coating the entire n-type surface with dielectric such as silicon dioxide, and then ink-jet printing a suitable etchant for the dielectric layer (such as dilute HF), everywhere the dielectric layer is to be removed). The uncoated areas can then be optionally etched to remove the n-type silicon, or else directly diffused with boron to convert the silicon into p-type polarity everywhere that the silicon is to be subsequently contacted by the metal. In the latter, the rear n-type surface is masked against the boron diffusion by the presence of the ink jet printed dielectric. Of key importance in this structure is that good electrical isolation is achieved between the n-type silicon and the p-type metal contact, which means there must not be any (or only minimal) penetration of the rear surface screen-printed metal through to the rear n-type silicon surface.

Figure 9:
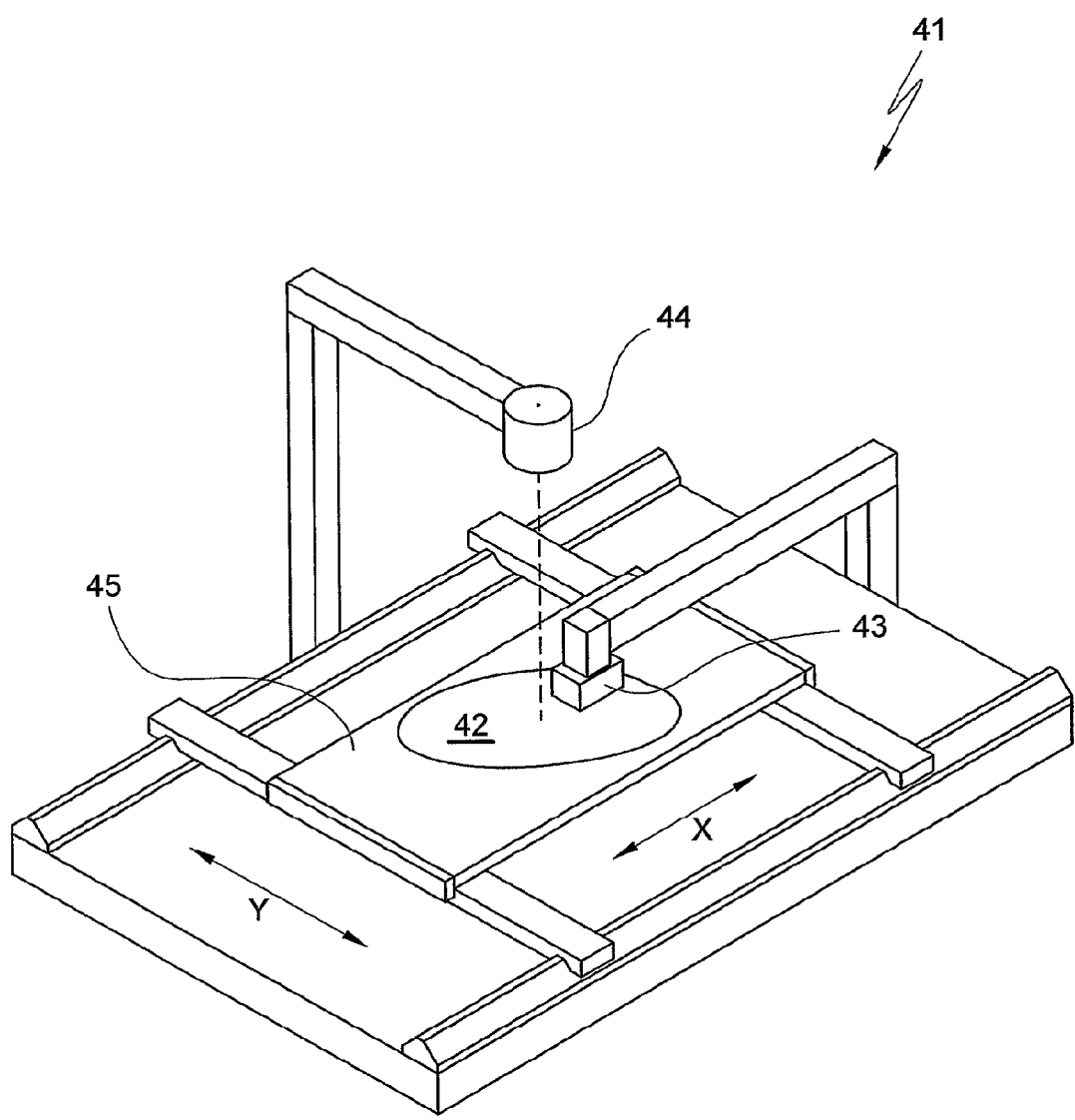
FIG. 9 illustrates an X-Y table with inkjet print head and laser scribing tool for an alternative processing sequence.
Figure 10:
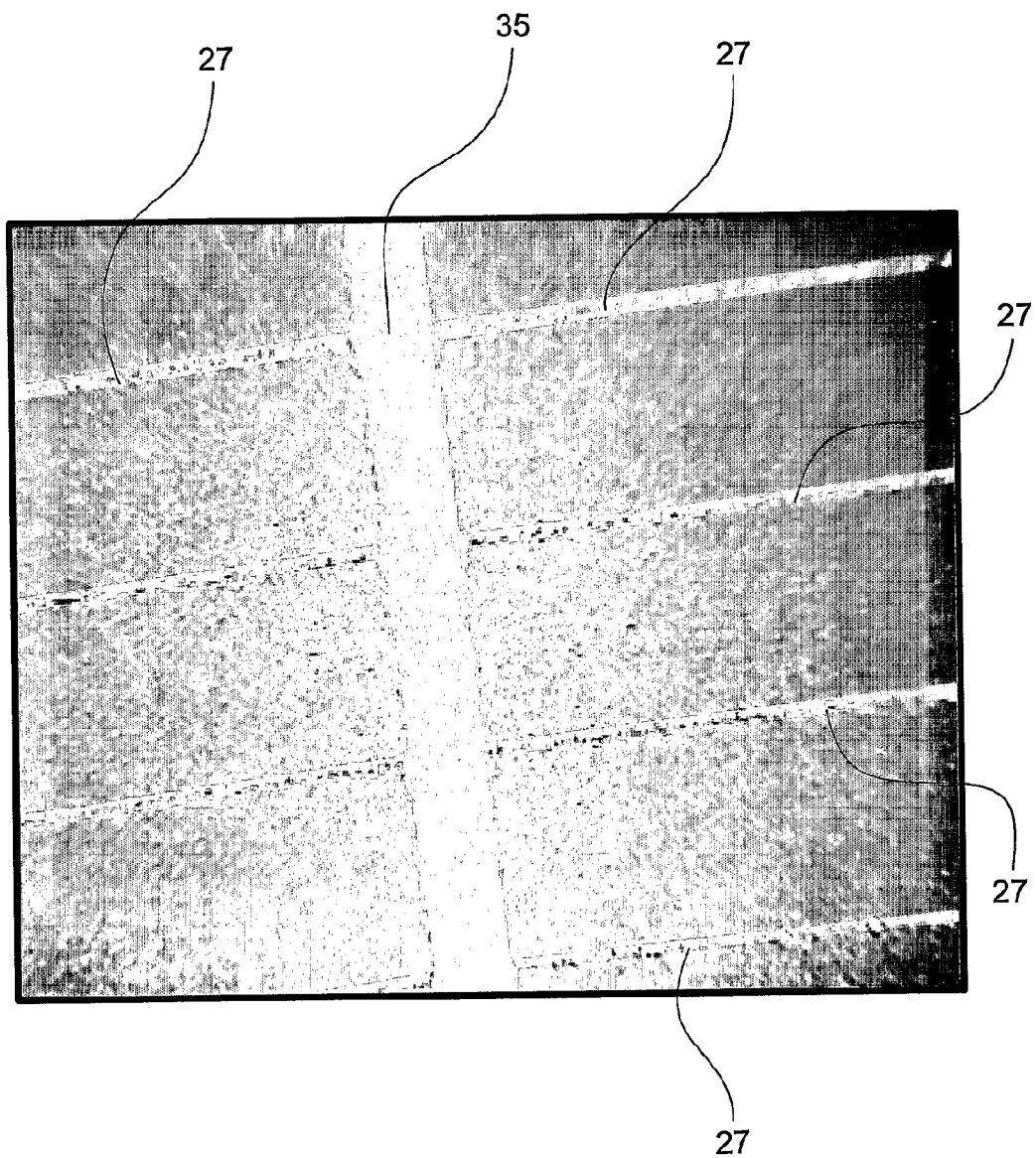
FIG. 10 is a photograph of the top surface of a cell with the present contact structure showing the top surface grooves and perpendicular metal contact fingers.

When implementing this contact scheme, as described above (based on the use of ink jet printing of dielectrics), a particularly powerful tool is an x-y table 41 illustrated in FIG. 9 having a travelling carrier 45 (that holds the substrate 42 on which the solar cell is being formed), combined with both ink jet printing heads 43 and laser scribing head or heads 44. This allows the substrate 42 to be moved in the 'X' and 'Y' directions under the stationary laser 44 and the stationary print head or heads 43 allowing heat to be applied by the laser 44 wherever desired in conjunction with the ink jet printing of the dielectric material. This facilitates localized heating of the dielectric (while simplifying alignment issues), laser doping from the dielectric layer (for the case where the ink jet printed dielectric layer contains dopants of the appropriate polarity), localized ablation of the dielectric if desired, and heat treating or ablation of silicon in the regions not coated by the dielectric. In this tool, the laser 44 could be one having a range of wavelengths and could be either Q-switched or continuous depending on the desired outcomes. The described tool avoids the alignment issues normally faced by trying to produce the described structures and carry out the described processes. Although the above has been described for use with screen-printed metal contacts, alternative metal deposition techniques such as (sputtering and evaporation) and a range of contact metals (such as aluminium and silver) can potentially also be used.

Example of Implementation of this Contact Scheme

Referring to FIGS. 2 to 7 and FIG. 10, the following processing sequence demonstrates an example of the use of this contact scheme:

1. The substrate 11 is subjected to a saw damage removal etch (30% NaOH at 70 degrees C. for 10 mins)
2. Surface texturing (not shown) is achieved on the top surface by etching with 2% NaOH at 90 degrees C. for 20 minutes.
3. Front and rear surface region diffusions are performed with phosphorus to 100-200 ohms per square (POCL3 source at 810 degrees for 12 mins to create front and rear n-type layers 12 and 38.
4. The wafer surfaces are then oxidized in steam at 950 degrees C. for 30 mins to produce the front and rear surface oxide layers 21, 22 seen in FIG. 2.
5. The front surface is then laser scribed 23, 23' through the front surface oxide 21, using a Q-switched NdYAG laser, to produce 20-50 micron deep grooves 27 for fingers 25 of heavily doped semiconductor, and wells 37 are laser drilled, in areas beneath the proposed location of the screen-printed metallization (ref to FIG. 7)
6. The top surface grooves/wells are etched with 12% NaOH at 52 degrees C. for 20 minutes.
7. A diffusion is then applied to the front surface regions of the grooves/wells 27, 37 using a POCL3 source at 980 degrees for 60 mins to produce the heavily doped region ($n^{++}$) 25, 25' in the grooves/wells to give the structure of FIG. 3, followed by 30 mins in oxygen at the same temperature so as to adequately protect the surface from subsequent chemical treatments associated with rear surface processing. To simplify the doping of the walls of the depressions (wells or grooves) in commercial processes this step may be avoided by deliberately adding dopants into the surface dielectric layer added in step 4 such that when the laser is used to drill surface depressions for the contacts in step 5 some of the dopants from the dielectric layer are automatically incorporated into the surface regions of the depressions, therefore avoiding the necessity for a separate diffusion step. However, in the highest performance devices the surface of the depressions are not doped in this way as the electrical performance of the cells is not quite as good.
8. The rear surface is laser drilled 24 through the rear surface oxide 22 to form the rear surface wells 28.
9. The rear surface wells 28 are then etched with 12% NaOH at 52 degrees C. for 20 minutes, while retaining front groove diffusion oxide/silicon dioxide to protect front grooves.
10. A boron diffusion is then applied to the surface regions of the rear wells 28, typically using boron tribromide at 980 degrees for 90 mins, to produce much higher doping concentrations ($p^{++}$) in the surface regions 26 of the rear surface wells 28 than the surface phosphorus diffusion 38 at the rear surface to give the structure of FIG. 4. To simplify the doping of the walls of the depressions (wells or grooves) in commercial processes this step may be avoided by deliberately adding dopants into the surface dielectric layer added in step 4 such that when the laser is used to drill surface depressions for the contacts in step 8 some of the dopants from the dielectric layer are automatically incorporated into the surface regions of the depressions, therefore avoiding the necessity for a separate diffusion step. However, in the highest performance devices the surface regions of the depressions are not doped in this way as the electrical performance of the cells is not quite as good.
11. A edge junction isolation is performed by plasma etching of the edges.
12. The diffusion oxide and surface masking oxide 21, 22 are removed from the front and rear surfaces using 5% HF.
13. A PECVD deposition of silicon nitride is performed to produce dielectric layers 29, 30 on front and rear surfaces giving the structure of FIG. 5.
14. The rear metal 36 is then screen-printed as grid or solid pattern of silver (although the screen printed metal paste could also contain a small concentration of aluminium). Air bubbles 33 may be trapped under the metal paste in the wells 28, when the paste is applied to the surface. These need not be problematic if the well is sufficiently shallow or if the area of the well is not entirely covered with paste such that the air may escape.
15. The rear metal 26 is the dried at 250 degrees for 3 minutes.
16. The front metal 35 is then screen-printed as a set of fingers of silver paste running perpendicularly to the front surface grooves 27 (ref FIGS. 7 and 10). Air bubbles 34 may be trapped under the metal paste in the grooves 27 (and wells 37), when the paste is applied to the surface. These need not be problematic if the grooves and/or wells are sufficiently shallow or if the area of the grooves and/or wells is not entirely covered with paste such that the air may escape.
17. The front metal 35 is then dried at 250 degrees for 3 minutes.
18. The front and rear metal 35, 36 are then co-fired (at typically 700 degrees depending on paste selection) to give the structure of FIG. 6.
19. The cell is then tested.

Note that in the silicon nitride deposition step, the nitride layers 29, 30 may extend to substantially completely coat the internal walls of a groove 27 or well 28, 37 (at least in the area to be contacted by the screen-printed metal 35, 36), with a thin dielectric (i.e. nitride) layer (see for example groove 27' and dielectric layer 29' in FIGS. 5 and 6), separating the subsequently screen-printed metal 35, 36 from the underlying heavily doped silicon layer 25, 26. However, during the firing step the metal contacts 35, 36 are driven through any such thin dielectric layer while remaining separated from the underlying semiconductor in regions where the dielectric is thicker.

Figure 11:
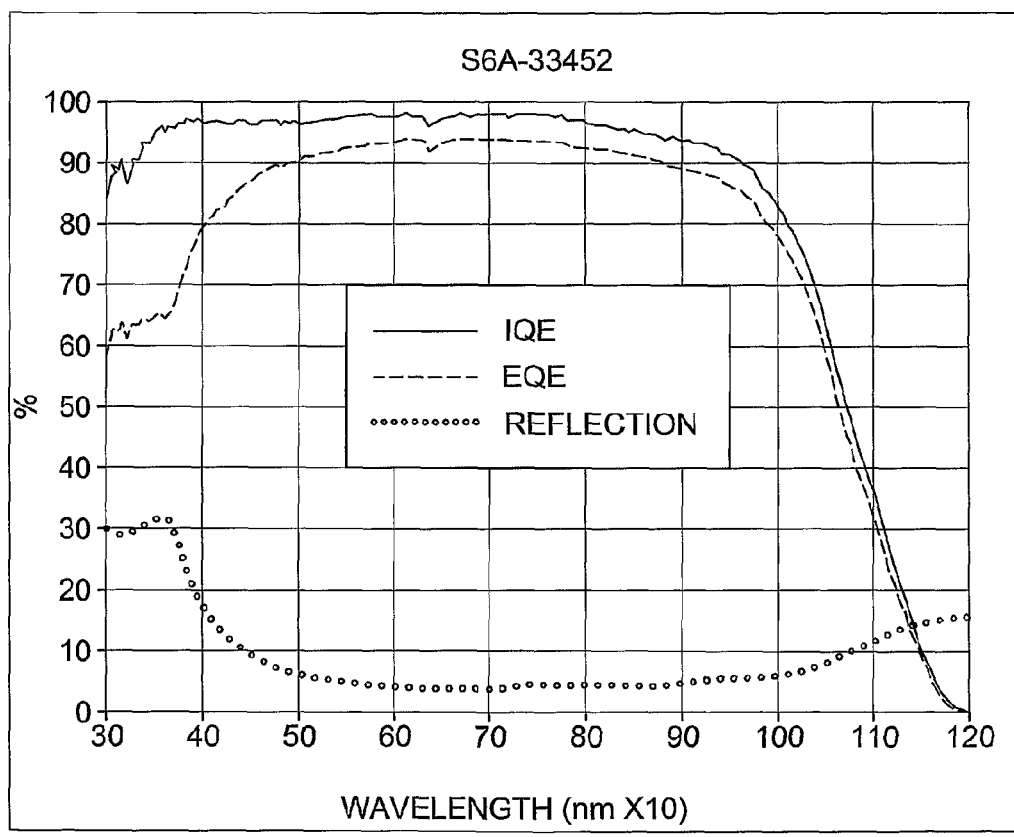
FIG. 11 is a graph illustrating spectral response for a sample with contacts of the structure of FIG. 6.

Cells produced using the above sequence have demonstrated high fill factors achieved through low resistive losses such as at the contacts, and high Jsc as a result of the low metal shading losses, low reflection surface, and excellent response to short wavelength light. A typical spectral response curve, illustrated in FIG. 11, shows the clear benefits for the devices produced by this method when compared to conventional screen-printed solar cells, with near unity internal quantum efficiencies for short wavelengths of light in the vicinity of 350 nm.

Figure 12:
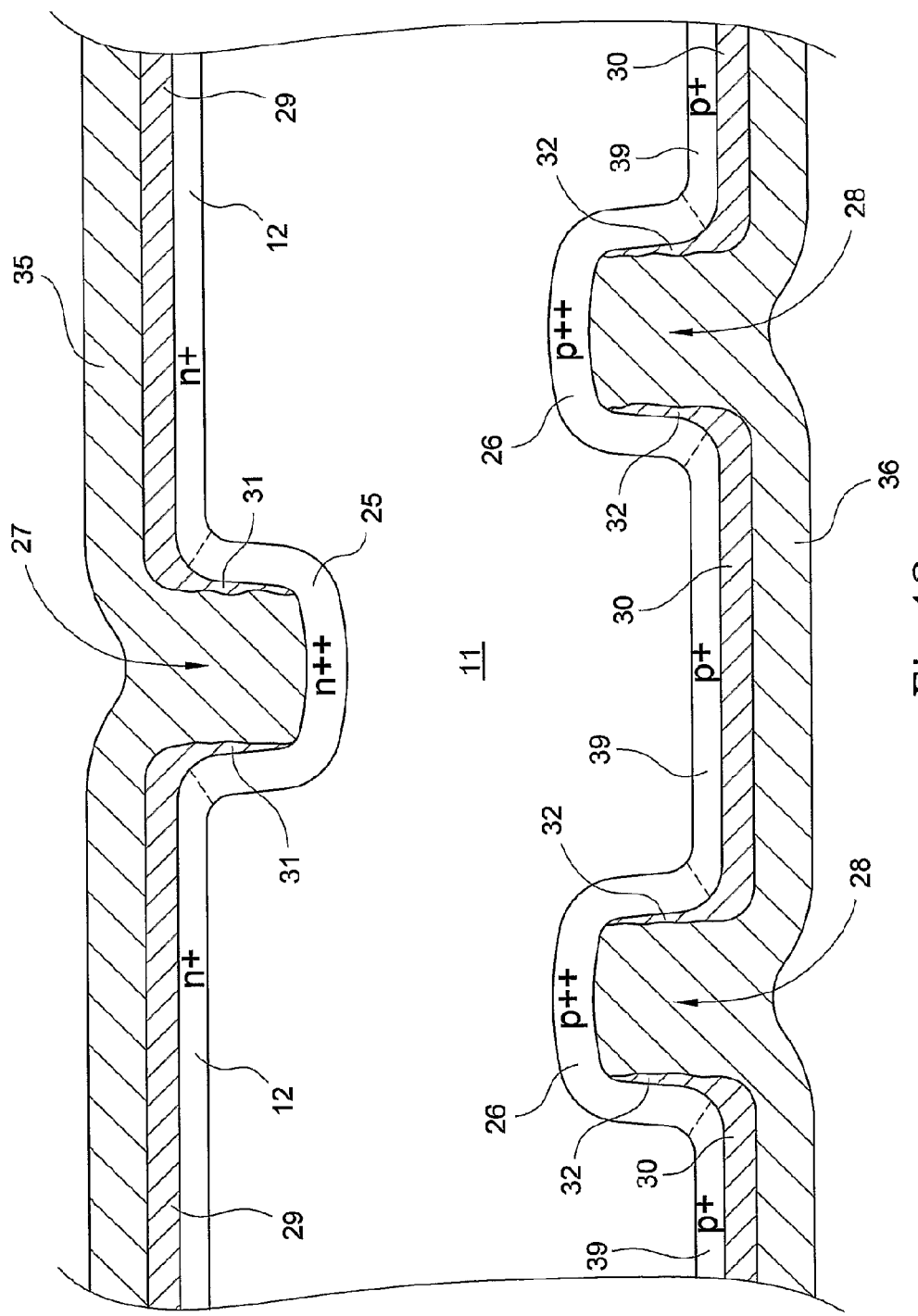
FIG. 12 is a schematic illustration of a first alternative embodiment to that shown in FIG. 6.
Figure 13:
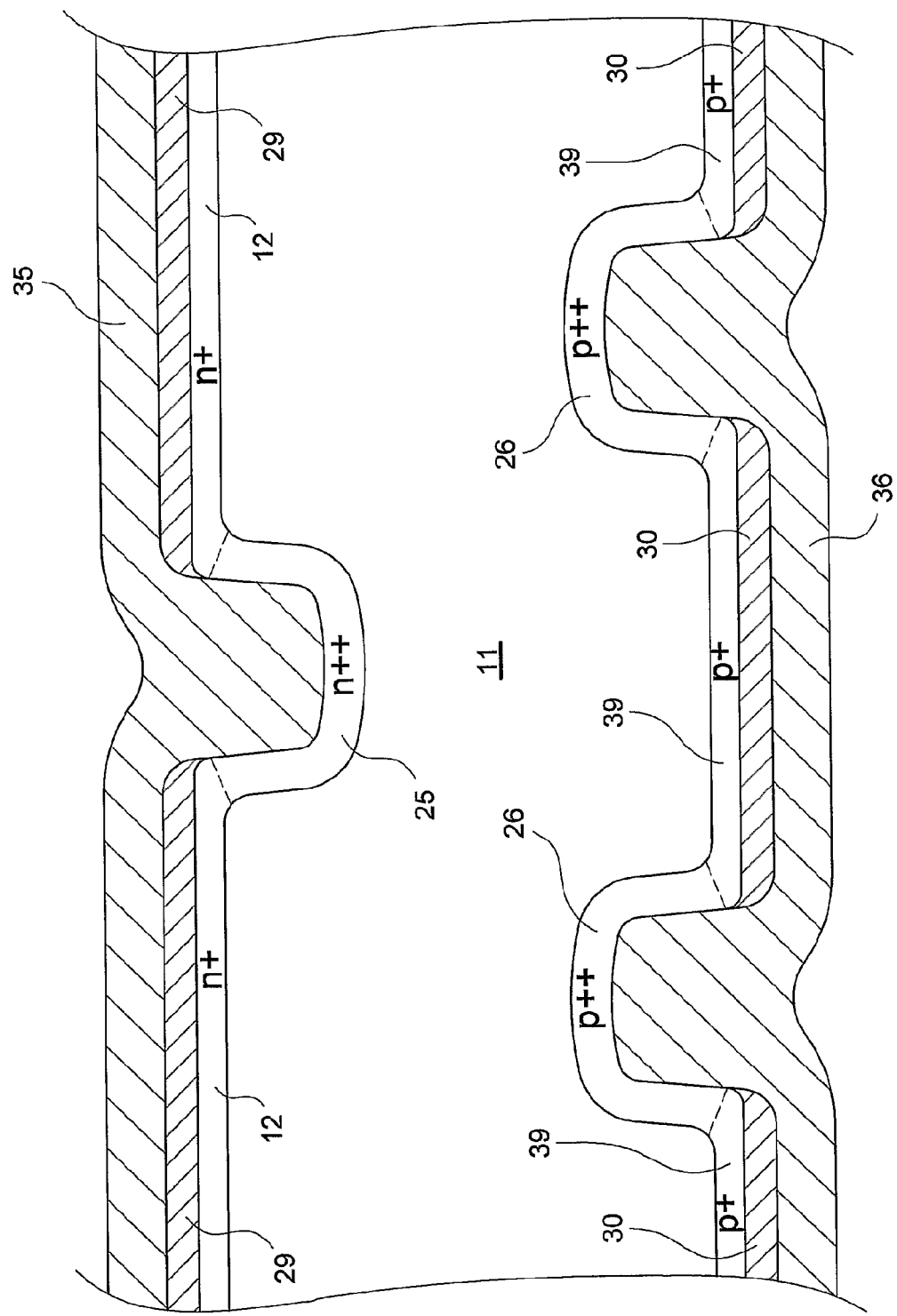
FIG. 13 is a schematic illustration of a second alternative embodiment to that shown in FIG. 6.

Referring to FIGS. 12 & 13, these show two alternate embodiments to those discussed above. In the case of FIG. 12 the n-type region 38 in the FIG. 6 embodiment is replaced with a p+-type region 39 similar to some prior art screen printed cells.

In FIG. 13 a similar structure to that of FIG. 12 is illustrated, however in this case the dielectric layers 29, 30 do not extend into the grooves or wells 27, 28 to form the thinner dielectric portions 32, 33 shown in FIGS. 6 & 12. This structure can be formed either by using the final dielectric layer as the doping mask (i.e. forming the grooves and wells through the final dielectric layer) or by applying the final dielectric layer after the grove and well doping steps but doing so using a method which allows accurate placement of this layer such as by inkjet printing as discussed above. This approach can also be applied to the structure in which the rear surface is lightly doped n-type except in the wells 28 as in FIG. 6.

Note that while cells formed on p-type wafers were described in the above examples, all polarities may be reversed for n-type wafers.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. A solar cell having adjacent regions of oppositely doped semiconductor material forming a pn junction substantially parallel to front and rear surfaces of the solar cell and a contact structure contacting the semiconductor material of one of the dopant types, the contact structure comprising:
   i) a plurality of depressions formed in a surface of the semiconductor material, in which semiconductor material regions forming internal wall surface regions' of the depressions are doped to the polarity of one of the semiconductor regions of the junction with which they are in electrical communication, the pn junction extending between said wall surface regions and the other oppositely doped region of the pn junction;
   ii) a dielectric layer formed over the surface of the semiconductor material of the cell and extending into the depressions, the dielectric layer being thinner or non-existent in a portion of each depression; and
   iii) a screen printed metal contact structure comprising screen printed metal fingers formed over the dielectric layer and electrically isolated from the front surface of the solar cell by the dielectric layer, the screen printed metal fingers crossing the depressions and extending into the depressions at each crossing to contact the semiconductor material regions forming internal wall surface regions in the depressions through the dielectric layer.

2. The solar cell of claim 1 wherein the dielectric layer extends into the depressions as a thinner layer than that part of the dielectric layer on the surface outside of the depressions and the contact structure extends through the thinner dielectric in the depressions to contact the underlying semiconductor material.

3. The solar cell of claim 1 wherein the wall surface regions of the depressions in one surface of the solar cell are deeper than the semiconductor material of similar dopant polarity forming the remainder of the respective surface regions.

4. The solar cell of claim 1 wherein the depressions comprise a plurality of parallel elongate grooves.

5. The solar cell of claim 4 wherein the depressions further comprise wells located between the grooves in regions to be covered by the metal contact structure.

6. The solar cell of claim 5 wherein the screen printed metal fingers of the metal contact structure comprises a set of the screen printed metal fingers running perpendicularly to the grooves, with interconnecting fingers running parallel to the grooves at intervals to form a grid.

7. The solar cell of claim 1 wherein the depressions comprise a plurality of parallel rows of wells.

8. The solar cell of claim 7 wherein the depressions further comprise wells located between parallel rows of wells in regions to be covered by the metal contact structure.

9. The solar cell of claim 7 wherein the screen printed metal fingers of the metal contact structure comprises a set of the screen printed metal fingers running over each of the rows of wells and interconnecting fingers running perpendicular to the rows of wells at intervals to form a grid.

10. A method for fabricating a contact structure on a solar cell comprising adjacent regions of oppositely doped semiconductor material forming a pn junction substantially parallel to front and rear surfaces of the solar cell, the method including:
    i) forming a plurality of depressions in a surface of the semiconductor material with semiconductor material regions forming internal wall surface regions of the depressions being doped to the polarity of one of the semiconductor regions of the junction, with which they are in electrical communication, and the pn junction extending between said wall surface regions and the other oppositely doped region of the junction;
    ii) forming a dielectric layer over the surface whereby the dielectric layer extends into the depressions and is thinner than the layer on the surface, or non-existent in a portion of each depression;
    iii) forming a screen printed metal contact structure comprising screen printed metal fingers over the dielectric layer and electrically isolated from the front surface of the solar cell by the dielectric layer, the screen printed metal fingers crossing the depressions and extending into the depressions at each crossing; and
    iv) firing the structure to sinter the screen printed contact structure whereby the contact structure contacts the semiconductor material regions forming internal wall surface regions in the depressions.

11. The method of claim 10 wherein the formation of the dielectric layer causes it to extend into the depressions as a thinner layer than that part of the dielectric layer on the surface outside of the depressions.

12. The method of claim 10 wherein the wall surface regions of the depressions in one surface of the solar cell are deeper than the semiconductor material of similar dopant polarity forming the remainder of the respective surface regions.

13. The method of claim 10 wherein the depressions are formed as a series of parallel elongate grooves.

14. The method of claim 13 wherein depressions are also formed as wells located between the grooves in regions to be covered by the metal contact structure.

15. The method of claim 13 wherein a set of the screen printed metal fingers are formed running perpendicularly to the grooves, with interconnecting fingers formed running parallel to the grooves at intervals to form a metal contact structure in the form of a grid.

16. The method of claim 10 wherein the depressions are formed as a series of parallel rows of wells.

17. The method of claim 16 wherein wells are also formed between parallel rows of wells in regions to be covered by the metal contact structure.

18. The method of claim 16 wherein a set of the screen printed metal fingers is formed running over each of the rows of wells and interconnecting fingers are formed running perpendicular to the rows of wells at intervals to form a metal contact structure in the form of a grid.

19. The method of claim 10 wherein the surface depressions are formed by forming a surface oxide layer and laser scribing through the oxide layer where the depressions are required to form the depressions.

20. The method of claim 19 wherein the openings in the surface oxide layer serve as a doping mask and the surface regions in the depressions are doped by applying a dopant through the openings in the surface oxide layer.

21. The method of claim 20 wherein after doping the surface regions of the depressions, the surface oxide layer is removed and replaced with a final dielectric layer which is thinner or non-existent in a portion of each depression than on the surface surrounding the depressions and is continuous on the surface surrounding the depressions to isolate the semiconductor surface surrounding the depressions from the subsequently formed contact structure.

* * * * *